United States Patent
Niimura

(10) Patent No.: US 10,989,813 B2
(45) Date of Patent: Apr. 27, 2021

(54) DISTANCE MEASUREMENT APPARATUS

(71) Applicant: DENSO CORPORATION, Kariya (JP)

(72) Inventor: Kosuke Niimura, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/374,035

(22) Filed: Apr. 3, 2019

(65) Prior Publication Data

US 2019/0227170 A1 Jul. 25, 2019

Related U.S. Application Data

(63) Continuation of application No. PCT/JP2017/036169, filed on Oct. 4, 2017.

(30) Foreign Application Priority Data

Oct. 6, 2016 (JP) .............................. JP2016-198066

(51) Int. Cl.
*H01S 5/042* (2006.01)
*G01S 17/10* (2020.01)
*G01C 3/06* (2006.01)
*H03K 17/16* (2006.01)
*H03K 17/78* (2006.01)
(Continued)

(52) U.S. Cl.
CPC ................ *G01S 17/10* (2013.01); *G01C 3/06* (2013.01); *G01S 7/484* (2013.01); *H01S 5/0428* (2013.01); *H02M 1/34* (2013.01); *H03K 17/08* (2013.01); *H03K 17/16* (2013.01); *H03K 17/78* (2013.01); *H02M 3/07* (2013.01)

(58) Field of Classification Search
CPC ............................... H01S 5/0428; G01S 17/10
See application file for complete search history.

(56) References Cited

U.S. PATENT DOCUMENTS

| | | | |
|---|---|---|---|
| 5,895,984 A * | 4/1999 | Renz ....................... | H01S 5/042 307/106 |
| 9,368,936 B1 * | 6/2016 | Lenius .................. | G01S 7/4814 |

(Continued)

FOREIGN PATENT DOCUMENTS

| | | |
|---|---|---|
| JP | 10-014229 A | 1/1998 |
| JP | 2016-152336 A | 8/2016 |

OTHER PUBLICATIONS

Morgott Stefan / Maric Josip, Operating the Pulsed Laser Diode SPL LL90_3; OSRAM Opto Semiconductors; Jun. 11, 2014; Application Note No. AN105, pp. 1-6.

*Primary Examiner* — Michael Carter
(74) *Attorney, Agent, or Firm* — Maschoff Brennan

(57) ABSTRACT

A distance measurement apparatus includes a light emission circuit that includes a switch, a capacitor, a light-emitting element, and a protection element. The light emission circuit charges and discharges the capacitor by opening and closing the switch based on a light emission control signal, and enables the light-emitting element to emit light using electric power during discharge by the capacitor. The light emission circuit is configured such that a parasitic inductance of a first circuit is greater than a parasitic inductance of a second circuit, where the first circuit is a circuit in which the switch, the capacitor, and the light-emitting element are connected in series and in a ring shape, and the second circuit is a circuit in which the switch, the capacitor, and the protection element are connected in series and in a ring shape.

8 Claims, 10 Drawing Sheets

(51) Int. Cl.
*H03K 17/08* (2006.01)
*H02M 1/34* (2007.01)
*G01S 7/484* (2006.01)
*H02M 3/07* (2006.01)

(56) References Cited

U.S. PATENT DOCUMENTS

2015/0268343 A1   9/2015  Uehira et al.
2017/0104416 A1*  4/2017  Kataoka ................. H02M 1/08

* cited by examiner

DISTANCE MEASUREMENT APPARATUS

CROSS-REFERENCE TO RELATED APPLICATIONS

The present application is a continuation application of International Application No. PCT/JP 2017/036169, filed Oct. 4, 2017, which claims priority to Japanese Patent Application No. 2016-198066, filed Oct. 6, 2016. The contents of these applications are incorporated herein by reference in their entirety.

BACKGROUND

Technical Field

The present disclosure relates to a distance measurement apparatus that measures a distance to an object.

Related Art

A technology is known in which a capacitor is charged and discharged using a switch, such as a transistor, a light-emitting element emits light using electric power during discharge of the capacitor, and a distance to an object is measured based on a timing at which a reflected wave is received.

SUMMARY

The present disclosure provides a distance measurement apparatus that includes a light emission circuit in which a parasitic inductance of a first circuit is greater than a parasitic inductance of a second circuit. The first circuit is a circuit in which a switch, a capacitor, and a light-emitting element provided in the light emission circuit are connected in series and in a ring shape. The second circuit is a circuit in which the switch, the capacitor, and the protection element in the light emission circuit are connected in series and in a ring shape.

DESCRIPTION OF THE EMBODIMENTS

In the technology in related art, an amount of emitted light can be controlled by the switch being closed during discharge from the capacitor. However, a surge voltage is applied to the switch at this time. Therefore, the switch is required to be provided with a measure to enable the switch to withstand the surge voltage. As a result of careful examination by the inventors, an issue has been found in that, although the surge voltage can be withstood if the switch itself is increased in size, responsiveness of the switch becomes poor.

An exemplary embodiment of the present disclosure is to enable a distance measurement apparatus that measures a distance to an object to improve tolerance towards a surge voltage without increasing a size of a switch, to the greatest possible extent.

The exemplary embodiment provides a distance measurement apparatus that includes a light emission circuit that includes a switch, a capacitor, a light-emitting element, and a protection element. The light emission circuit charges and discharges the capacitor by opening and closing the switch based on a light emission control signal, and enables the light-emitting element to emit light using electric power during discharge by the capacitor. The light emission circuit is configured such that a parasitic inductance of a first circuit is greater than a parasitic inductance of a second circuit, where the first circuit is a circuit in which the switch, the capacitor, and the light-emitting element are connected in series and in a ring shape, and the second circuit is a circuit in which the switch, the capacitor, and the protection element are connected in series and in a ring shape.

According to this distance measurement apparatus, the parasitic inductance of the first circuit is greater than the parasitic inductance of the second circuit. Thus, parasitic inductance by wiring and elements that generate a surge voltage that is applied to the switch can be suppressed. As a result, the surge voltage that is applied to the switch can be suppressed.

An embodiment of the present disclosure will hereinafter be described with reference to the drawings.

1. Embodiment

[1-1. Configuration]

Figure 1:
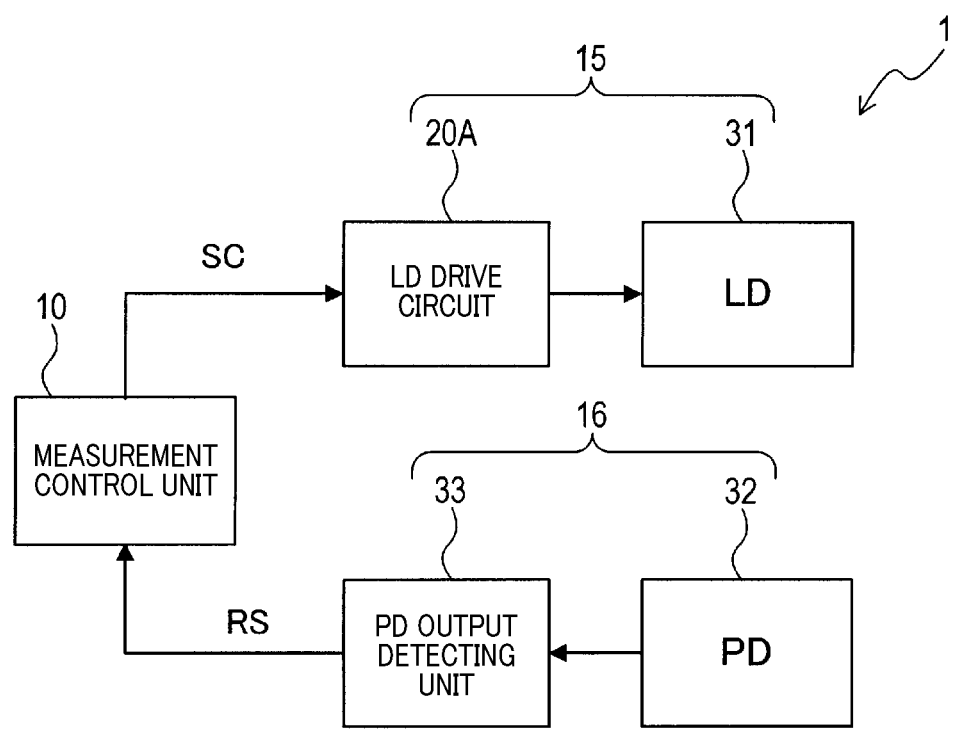
FIG. 1 is a block diagram of a configuration of a distance measurement apparatus.

A distance measurement apparatus 1 of the present disclosure is configured to measure a distance to an object based on a reflected wave of light that is emitted from a light source. Specifically, as shown in FIG. 1, the distance measurement apparatus 1 includes a measurement control unit 10, a light emission circuit 15, and a light reception circuit 16.

The light emission circuit 15 includes an LD drive circuit (light source drive circuit) 20A and an LD 31. The LD refers to a laser diode. The light reception circuit 16 includes a PD 32 and a PD output detecting unit 33. The PD refers to a photodiode.

The LD drive circuit 20A makes the LD 31 emit light by controlling the on/off of a switch 21, described hereafter, based on a light emission control signal SC that is a rectangular wave outputted from the measurement control unit 10. At this time, a light emission time of the LD 31 is controlled by a pulse length (pulse duration) Δt of the light emission control signal SC, that is, an amount of time over which the output of the rectangular wave is continued.

A laser light is emitted from the LD 31 and reflected light when the laser light is reflected by an object of some kind is received by the PD 32. A voltage based on the intensity of the reflected light is outputted from the PD 32 as an analog signal. The PD output detecting unit 33 performs an analog-to-digital (AD) conversion on the signal and outputs, as a light reception signal RS, the converted signal to the measurement control unit 10.

The measurement control unit 10 is mainly configured by a known microcomputer that includes a central processing unit (CPU), a random access memory (RAM), a read-only memory (ROM), and a semiconductor memory such as a flash memory. Various functions of the measurement control unit 10 are implemented by the CPU running a program that is stored in a non-transitory computer-readable storage medium. In this example, the semiconductor memory corresponds to the non-transitory computer-readable storage medium in which the program is stored.

In addition, as a result of the program being run, a method corresponding to the program is performed. The non-transitory computer readable storage medium refers to a storage medium from which electromagnetic waves are excluded. The measurement control unit 10 may be configured by one or a plurality of microcomputers.

The measurement control unit 10 provides a light emission control function that generates and outputs the light emission control signal SC and an object detection function that detects a position of the object based on the light reception signal RS, as a configuration of functions that are implemented as a result of the CPU running the program. A means for actualizing the foregoing elements that configure the measurement control unit 10 is not limited to software. Some or all of the elements may be implemented using a single piece or a plurality of pieces of hardware. For example, when the above-described functions are implemented by an electronic circuit that is hardware, the electronic circuit may be implemented by a digital circuit that includes numerous logic circuits, an analog circuit, or a combination of a digital circuit and an analog circuit.

In the light emission control function, the light emission control signal SC that has an arbitrary pulse length $\Delta t$ is generated. The light emission control signal SC may be set based on surrounding luminance, vehicle speed, a distance to an object serving as a target that is acquired in advance, or the like.

In the object detection function, the distance to the object that has reflected the laser light is calculated based on an amount of time from when the LD 31 emits the laser light until the reflected light thereof is acquired.

Figure 2:
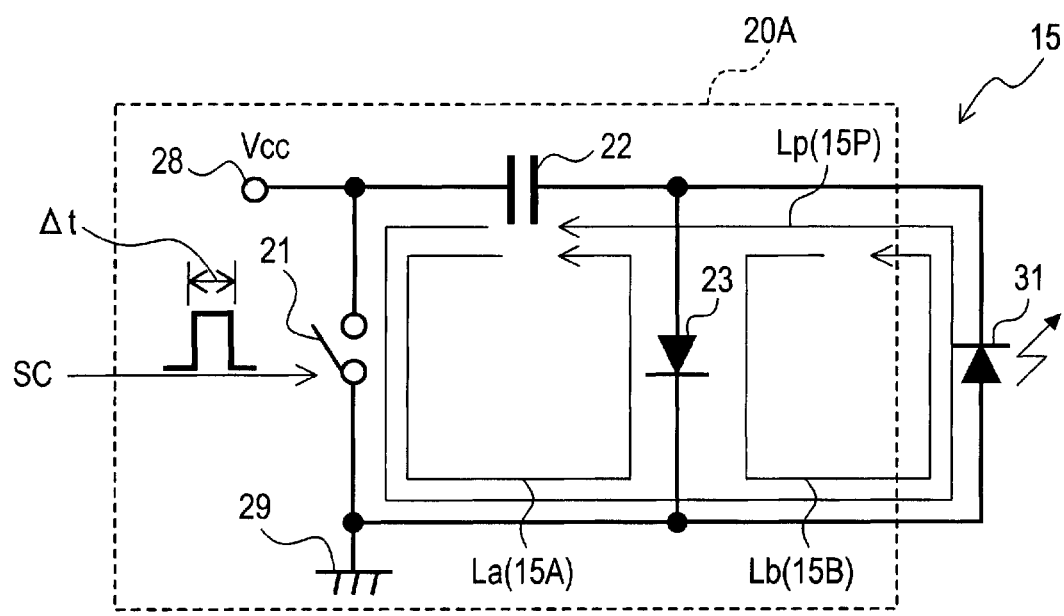
FIG. 2 is a circuit diagram of a light emission circuit according to an embodiment.

As shown in FIG. 2, the LD drive circuit 20A includes the switch 21, a capacitor 22, and a Dp 23. The Dp refers to a protection element. Specifically, for example, a protection diode corresponds to the protection element. The Dp 23 is arranged in parallel with the switch 21 and the LD 31. The Dp 23 provides a function for protecting the LD 31 as a result of the voltage applied to the LD 31 flowing through the Dp 23.

In the LD drive circuit 20A, a power supply 28 and a ground 29 are respectively connected to both ends of a switch 21. In particular, the power supply 28 is connected to a terminal on the capacitor 22 side of the switch 21. A potential of the power supply 28 is a value obtained by Vcc being added to a potential of the ground 29. In addition, the light emission circuit 15 includes the LD drive circuit 20A and the LD 31.

The light emission circuit 15 is configured to charge and discharge the capacitor 22 by opening and closing the switch 21 based on the light emission control signal SC, and making the LD 31 emit light using electric power during discharge by the capacitor 22. Specifically, when the light emission control signal SC is at a low level, the switch 21 is in an off state. At this time, the capacitor 22 is charged by a potential difference between the power supply 28 and the ground 29.

In addition, when the light emission control signal SC is at a high level, the switch 21 is in an on state. Charge that is stored in the capacitor 22 is discharged. At this time, a current flows to the LD 31 and the LD 31 emits light.

Here, the light emission circuit 15 has a circuit in which the switch 21, the capacitor 22, and the LD 31 are connected in series and in a ring shape. This circuit is referred to as a first circuit 15P. In addition, the light emission circuit 15 has a circuit in which the switch 21, the capacitor 22, and the Dp 23 are connected in series and in a ring shape. This circuit is referred to as a second circuit 15A. Furthermore, the light emission circuit 15 has a circuit in which the LD 31 and the Dp 23 are connected in series and in a ring shape. This circuit is referred to as a third circuit 15B.

Figure 3:
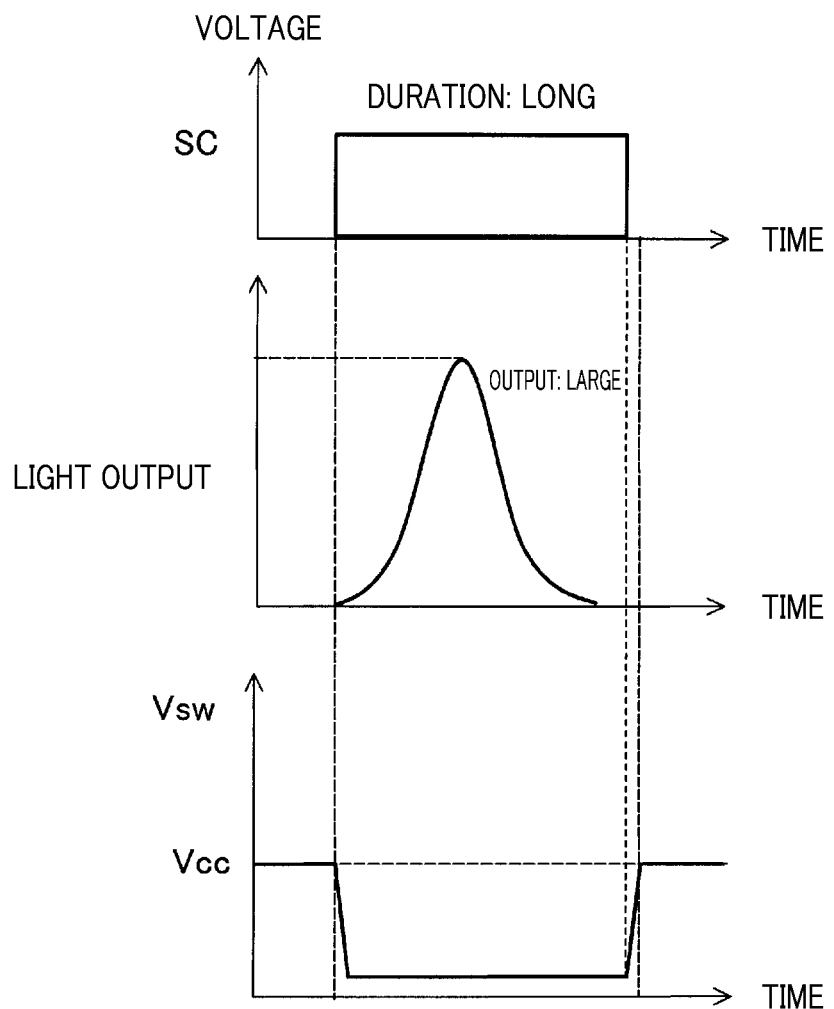
FIG. 3 is a graph of a relationship between light output based on a light emission control signal and a switch voltage, when a pulse length (pulse duration) of the light emission control signal is long.

In the light emission circuit 15 that is configured as described above, when the pulse length $\Delta t$ of the light emission control signal SC is increased, as shown in FIG. 3, the output of light from the LD 31 increases. However, when the pulse length $\Delta t$ of the light emission control signal exceeds a dischargeable time of the capacitor 22, the discharge from the capacitor 22 ends and the LD 31 is turned off. At this time, a switch voltage Vsw that indicates a potential difference across the switch 21 is within a range from 0 to Vcc. A surge voltage caused by parasitic inductance is hardly generated.

Figure 4:
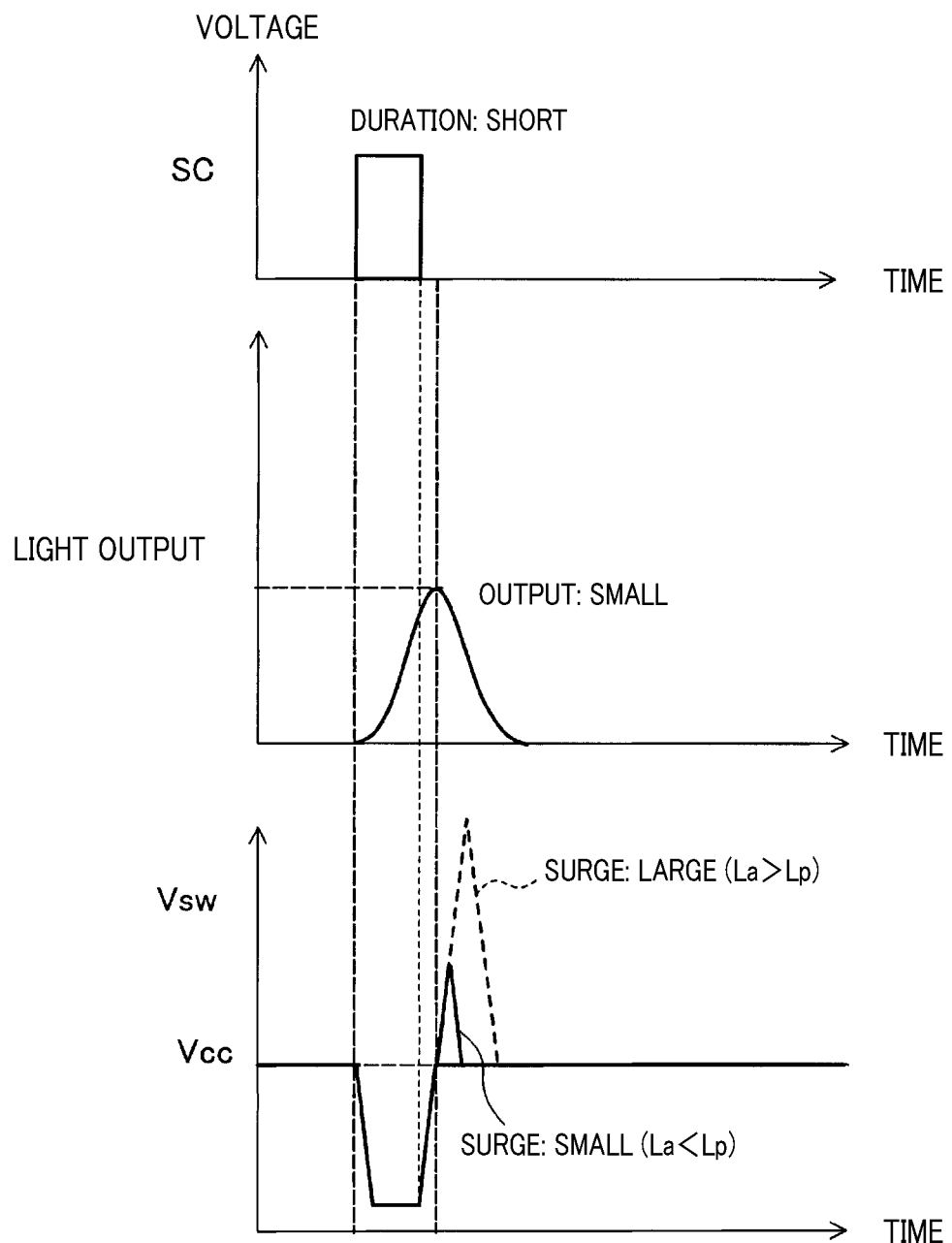
FIG. 4 is a graph of a relationship between light output based on a light emission control signal and a switch voltage, when the pulse length of the light emission control signal is short.

However, when the pulse length $\Delta t$ of the light emission control signal SC is decreased, as shown in FIG. 4, during discharge of the capacitor 22, the discharge is interrupted by the switch 21. In this case, although the output of light from the LD 31 can be controlled to be small, a case in which the switch voltage Vsw instantaneously exceeds the potential Vcc of the power supply 28 as a result of parasitic inductance, that is, a so-called surge voltage is generated often occurs.

To suppress the surge voltage to the greatest possible extent, the light emission circuit 15 includes the following configurations.

[1] A parasitic inductance Lp of the first circuit 15P is greater than a parasitic inductance La of the second circuit 15A.

[2] The parasitic inductance La of the second circuit 15A is less than a parasitic inductance Lb of the third circuit 15B.

[3] A wiring length between the switch 21 and the Dp 23 is shorter than a wiring length between the switch 21 and the LD 31.

[4] An internal inductance of the Dp 23 is less than an internal inductance of the LD 31. Here, the internal inductance expresses the ease with which a magnetic field is generated, among characteristics of an element as a coil, as a value.

The configurations from [1] to [4] above are devised to suppress parasitic inductance by wiring and elements that generate the surge voltage that is applied to the switch 21. It is thought that parasitic inductance can be suppressed by the wiring length being shortened, an area of an area surrounded by the wiring being reduced, a shield against magnetism generated by the current being provided, and the like. According to the present embodiment, as a result of the parasitic inductance being suppressed as an overall current, and enabling the above-described conditions to be met by the relative value of the parasitic inductance of each circuit as well, the surge voltage applied to the switch 21 is suppressed.

As a result of at least one of the above-described configurations being provided, as shown in FIG. 4, changes in the switch voltage Vsw are suppressed. For example, when none of the configurations are provided, as indicated by a broken line in the graph that shows the switch voltage Vsw in FIG. 4, a surge voltage that exceeds twice the potential of Vcc may be generated. However, in the configuration according to the present embodiment, as indicated by a solid line in the graph that shows the switch voltage Vsw in FIG. 4, the surge voltage can be suppressed to an extent that the surge voltage slightly exceeds the potential of Vcc.

[1-2. Effects]

According to a first embodiment described in detail above, the following effects are achieved.

(1a) The distance measurement apparatus 1 of the present disclosure includes the light emission circuit 15 that includes the switch 21, the capacitor 22, the LD 31, and the Dp 23. The light emission circuit 5 charges and discharges the capacitor 22 by opening and closing the switch 21 based on the light emission control signal SC, and makes the LD 31 generate light by electric power during discharge by the capacitor 22. In addition, in the light emission circuit 15, the circuit in which the switch 21, the capacitor 22, and the LD 31 are connected in series and in a ring shape is the first circuit 15P, and the circuit in which the switch 21, the capacitor 22, and the Dp 23 are connected in series and in a ring shape is the second circuit 15A. The light emission circuit 15 is configured such that the parasitic inductance Lp of the first circuit 15P is greater than the parasitic inductance La of the second circuit 15A.

As a result of the distance measurement apparatus 1 such as this, because the configuration is such that the parasitic inductance Lp of the first circuit 15P is greater than the parasitic inductance La of the second circuit 15A, the surge voltage that is applied to the switch 21 can be suppressed.

(1b) In the above-described distance measurement apparatus 1, in the light emission circuit 15, the circuit in which the LD 31 and the Dp 23 are connected in series and in a ring shape is the third circuit 15B. The light emission circuit 15 is configured such that the parasitic inductance La of the second circuit 15A is less than the parasitic inductance Lb of the third circuit 15B.

As a result of the distance measurement apparatus 1 such as this, because the parasitic inductance La of the second circuit 15A is less than the parasitic inductance Lb of the third circuit 15B, the surge voltage that is applied to the switch 21 can be further suppressed. Consequently, the light emission circuit 15 can be further reduced in size.

(1c) In the above-described distance measurement apparatus 1, the wiring length between the switch 21 and the Dp 23 is shorter than the wiring length between the switch 21 and the LD 31.

As a result of the distance measurement apparatus 1 such as this, the surge voltage that is generated as a result of the wiring between the switch 21 and the Dp 23 can be reduced. Therefore, the surge voltage that is applied to the switch 21 can be further suppressed (1d) In the above-described distance measurement apparatus 1, the internal inductance of the Dp 23 is less than the internal inductance of the LD 31.

As a result of the distance measurement apparatus 1 such as this, the surge voltage is not easily generated from the Dp 23. Therefore, the surge voltage that is applied to the switch 21 can be further suppressed.

2. Other Embodiments

An embodiment of the present disclosure is described above. However, the present disclosure is not limited to the above-described embodiment and can be carried out with various modifications.

(2a) According to the above-described embodiment, the LD drive circuit 20A is used as a light source drive circuit provided in the distance measurement apparatus 1. However, the present invention is not limited thereto. For example, LD drive circuits 20B, 20C, 20D, 20E, 20F, and 20G described below can also be used as the light source drive circuit. Effects similar to above-described (1a) can be achieved as a result of such configurations as well.

Figure 5:
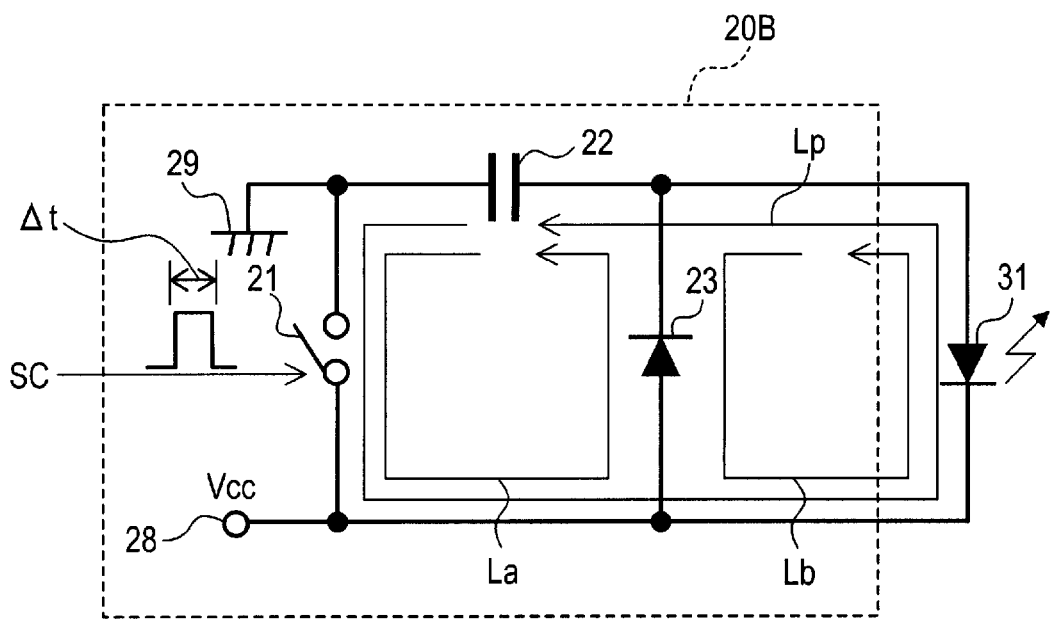
FIG. 5 is a circuit diagram of a light emission circuit in a first variation example.

As shown in FIG. 5, in the LD drive circuit 20B of a first variation example, the ground 29 is connected to the terminal on the capacitor 22 side of the switch 21. The power supply 28 is connected to the terminal on the side opposite the capacitor 22 of the switch 21.

Figure 6:
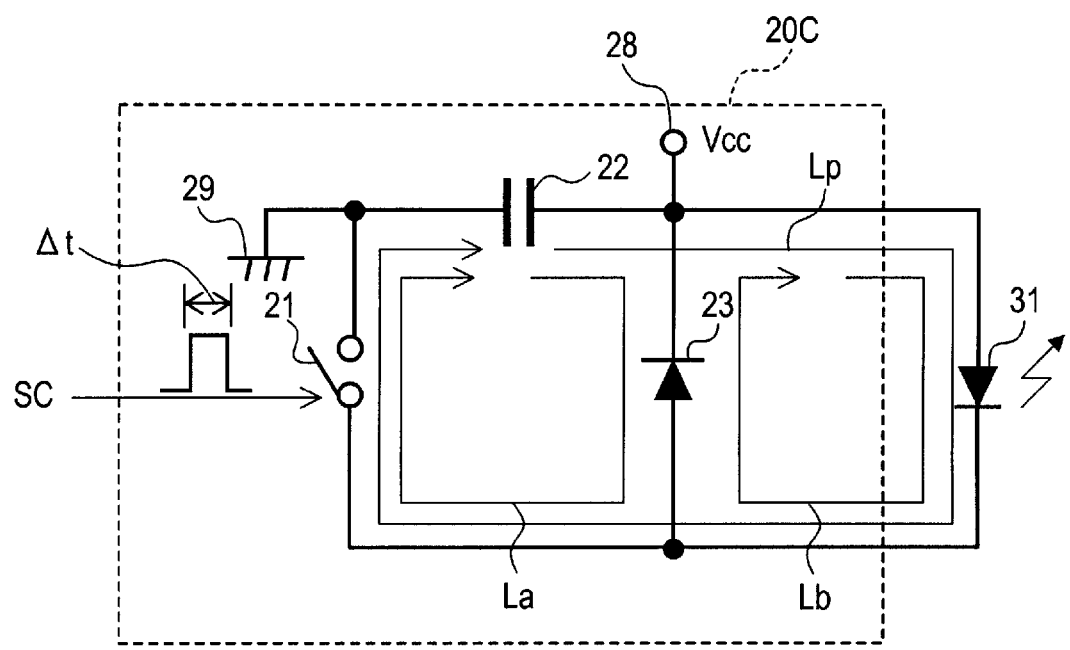
FIG. 6 is a circuit diagram of a light emission circuit in a second variation example.

As shown in FIG. 6, in the LD drive circuit 20C of a second variation example, the ground 29 is connected to the terminal on the capacitor 22 side of the switch 21, and the power supply 28 is connected to a terminal on the LD 31 side of the capacitor 22.

Figure 7:
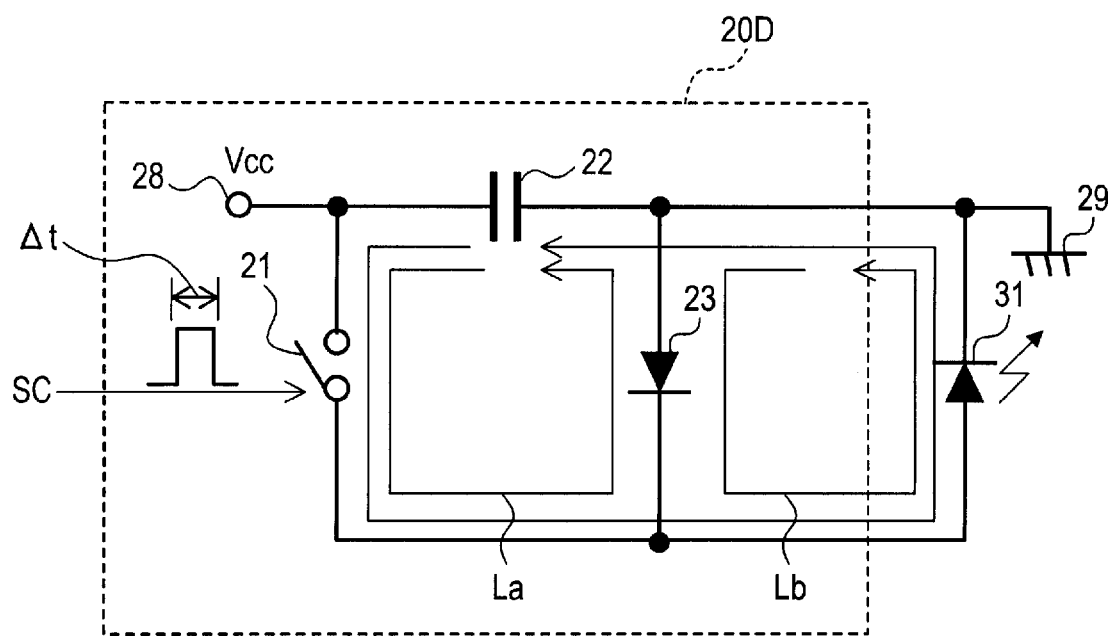
FIG. 7 is a circuit diagram of a light emission circuit in a third variation example.

As shown in FIG. 7, in the LD drive circuit 20D according to a third variation example, the power supply 28 is connected to the terminal on the capacitor 22 side of the switch 21, and the ground 29 is connected to the terminal on the LD 31 side of the capacitor 22.

Figure 8:
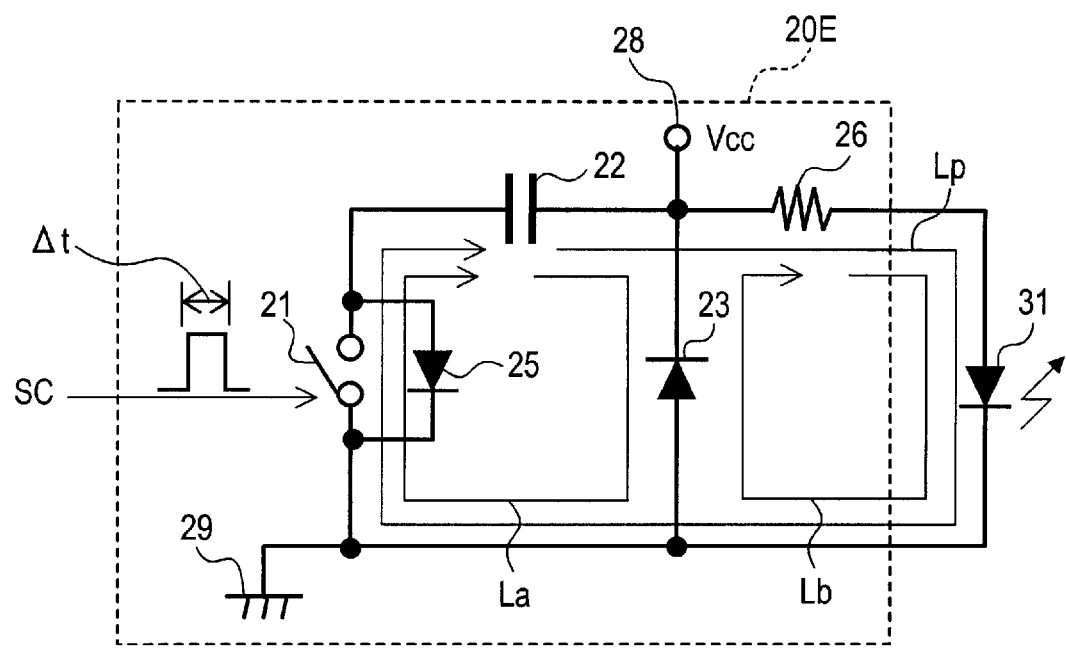
FIG. 8 is a circuit diagram of a light emission circuit in a fourth variation example.

As shown in FIG. 8, in the LD drive circuit 20E of a fourth variation example, the power supply 28 is connected to a terminal on the side opposite the switch 21 of the capacitor 22, and the ground 29 is connected to the terminal on the side opposite the capacitor 22 of the switch 21. In addition, in the LD drive circuit 20E, a diode 25 that connects both ends of the switch 21, and a current limiting resistor 26 that is connected in series between the power supply 28 and the LD 31 may be provided. The diode 25 and the current limiting resistor 26 contribute to the suppression of the surge voltage and the current applied to the switch 21.

Figure 9:
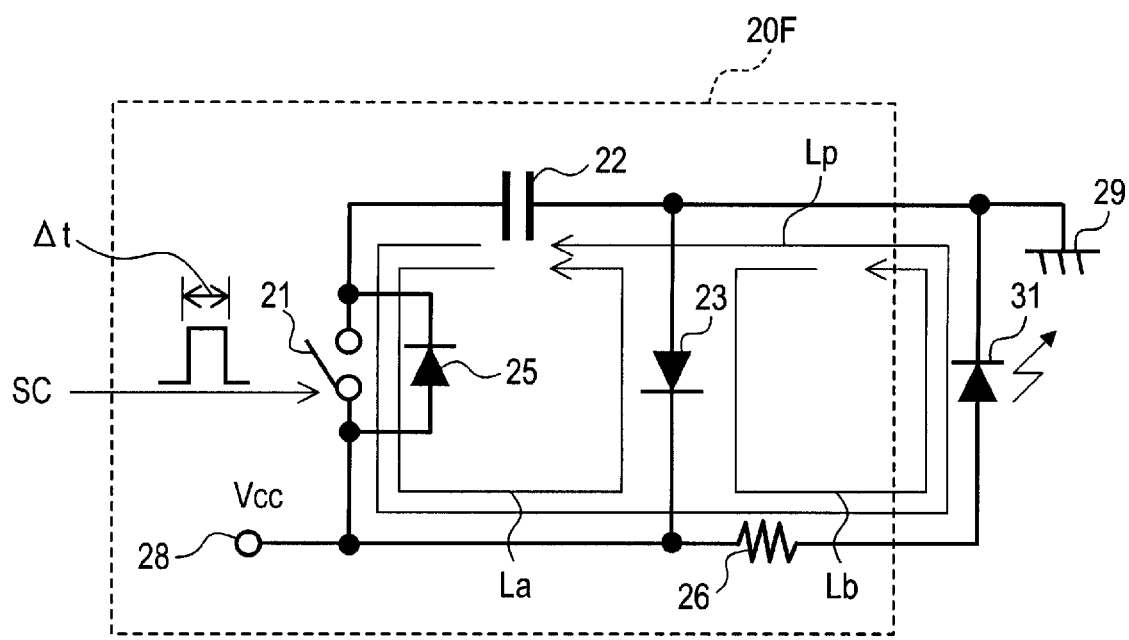
FIG. 9 is a circuit diagram of a light emission circuit in a fifth variation example.

As shown in FIG. 9, in the LD drive circuit 20F of a fifth variation example, the ground 29 is connected to the terminal on the side opposite the switch 21 of the capacitor 22, and the power supply 28 is connected to the terminal on the side opposite the capacitor 22 of the switch 21. In addition, in the LD drive circuit 20F, the diode 25 is arranged so as to connect both ends of the switch 21, and the current limiting resistor 26 is connected in series between the power supply 28 and the LD 31.

Figure 10:
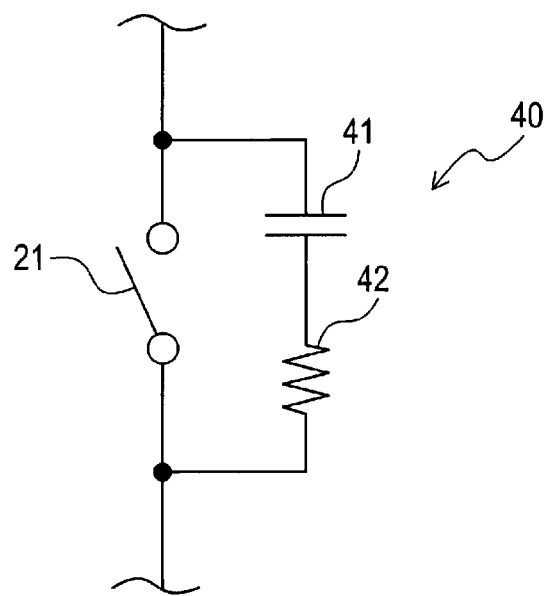
FIG. 10 is a circuit diagram of a portion of a light emission circuit in a sixth variation example.

As shown in FIG. 10, in the LD drive circuit 20G of a sixth variation example, a snubber circuit 40 that is connected to both ends of the switch 21 is further provided. The snubber circuit 40 is configured such that a capacitor 41 and a resistor 42 are connected in series to each other. The snubber circuit 40 is arranged so as to be in parallel with the switch 21.

According to the distance measurement apparatus 1, the snubber circuit 40 charges the capacitor 41 with a portion of the voltage that is applied to the switch 21. Thus, the surge voltage that is applied to the switch 21 can be further suppressed.

(2b) A plurality of functions provided by a single constituent element according to the above-described embodiments may be implemented by a plurality of constituent elements. A single function provided by a single constituent element may be implemented by a plurality of constituent elements.

In addition, a plurality of functions provided by a plurality of constituent elements may be implemented by a single constituent element. A single function provided by a plurality of constituent elements may be implemented by a single constituent element. Furthermore, a part of a configuration according to the above-described embodiments may be omitted.

Moreover, at least a part of a configuration according to an above-described embodiment may be added to or replace a configuration according to another of the above-described embodiments. Any mode included in the technical concept specified by the wordings of the scope of claims is an embodiment of the present disclosure.

(2c) The present disclosure can also be implemented by various modes in addition to the above-described distance measurement apparatus, such as a distance measurement method for a system including the distance measurement apparatus as a constituent element.

3. Corresponding Relationships Between Configurations According to the Embodiments and Configurations of the Present Disclosure According to the above-described embodiment, the LD 31 corresponds to a light-emitting element of the present disclosure. According to the above-described embodiment, the Dp 23 corresponds to a protection element of the present disclosure.

What is claimed is:

1. A distance measurement apparatus that measures a distance to an object based on a reflected wave of light that is emitted from a light source, the distance measurement apparatus comprising:
   a light emission circuit that includes a switch, a capacitor, a light-emitting element, and a protection element, the light emission circuit charges and discharges the capacitor by opening and closing the switch based on a light emission control signal, and the light emission circuit enables the light-emitting element to emit light using electric power during discharge by the capacitor,
   wherein the light emission circuit is configured such that a parasitic inductance of a first circuit is greater than a parasitic inductance of a second circuit to suppress surge voltage that is generated during discharge of the capacitor and applied to the switch in a case where a pulse length of the light emission control signal is shorter than a dischargeable duration of the capacitor, where
   the first circuit is a circuit in which the switch, the capacitor, and the light-emitting element are connected in series and in a ring shape, and
   the second circuit is a circuit in which the switch, the capacitor, and the protection element are connected in series and in a ring shape,
   wherein the protection element is connected in parallel to the switch between the power supply and a ground, and
   wherein the light emission circuit is configured such that the parasitic inductance of the second circuit is less than a parasitic inductance of a third circuit to suppress the surge voltage that is generated during discharge of the capacitor and applied to the switch in the case where the pulse length of the light emission control signal is shorter than the dischargeable duration of the capacitor, where
   the third circuit is a circuit in which the light-emitting element and the protection element are connected in series and in a ring shape.

2. The distance measurement apparatus according to claim 1, wherein:
   a wiring length between the switch and the protection element is shorter than a wiring length between the switch and the light-emitting element.

3. The distance measurement apparatus according to claim 2, wherein:
   an internal inductance of the protection element is less than an internal inductance of the light-emitting element.

4. The distance measurement apparatus according to claim 3, further comprising:
   a snubber circuit that is connected to both terminals of the switch.

5. The distance measurement apparatus according to claim 2, further comprising:
   a snubber circuit that is connected to both terminals of the switch.

6. The distance measurement apparatus according to claim 1, wherein:
   an internal inductance of the protection element is less than an internal inductance of the light-emitting element.

7. The distance measurement apparatus according to claim 6, further comprising:
   a snubber circuit that is connected to both terminals of the switch.

8. The distance measurement apparatus according to claim 1, further comprising:
   a snubber circuit that is connected to both terminals of the switch.

\* \* \* \* \*